(12) United States Patent
Kuo et al.

(10) Patent No.: US 12,298,331 B2
(45) Date of Patent: *May 13, 2025

(54) POWER DETECTION CIRCUIT

(71) Applicant: Taiwan Semiconductor Manufacturing Company, Ltd., Hsinchu (TW)

(72) Inventors: Chia-Chen Kuo, Hsinchu (TW); Chiting Cheng, Taichung (TW); Wei-jer Hsieh, Hsinchu (TW); Yangsyu Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/587,508

(22) Filed: Feb. 26, 2024

(65) Prior Publication Data

US 2024/0201232 A1    Jun. 20, 2024

Related U.S. Application Data

(63) Continuation of application No. 18/178,900, filed on Mar. 6, 2023, now Pat. No. 11,913,980, which is a continuation of application No. 16/935,608, filed on Jul. 22, 2020, now Pat. No. 11,598,794.

(51) Int. Cl.
*H02H 9/00* (2006.01)
*G01R 19/165* (2006.01)
*H02H 1/00* (2006.01)
*H02H 9/02* (2006.01)

(52) U.S. Cl.
CPC . *G01R 19/16519* (2013.01); *G01R 19/16538* (2013.01); *H02H 1/0007* (2013.01); *H02H 9/02* (2013.01)

(58) Field of Classification Search
None
See application file for complete search history.

(56) References Cited

U.S. PATENT DOCUMENTS

| | | | |
|---|---|---|---|
| 6,992,489 B2 * | 1/2006 | Bhattacharya ... | G01R 19/16519 324/99 D |
| 8,022,734 B1 * | 9/2011 | Broughton ......... | H04L 25/0272 327/60 |
| 11,598,794 B2 * | 3/2023 | Kuo ................. | G01R 19/16566 |
| 11,913,980 B2 | 2/2024 | Kuo et al. | |

(Continued)

FOREIGN PATENT DOCUMENTS

| | | |
|---|---|---|
| CN | 106712513 A | 5/2017 |
| TW | 200528738 A | 9/2005 |
| TW | I684770 B | 2/2020 |

*Primary Examiner* — Stephen W Jackson
(74) *Attorney, Agent, or Firm* — Merchant & Gould P.C.

(57) ABSTRACT

A power detection circuit is provided. The power detection circuit includes a comparator circuit operative to generate an output signal in response to an input signal. The output signal is configured to change from a first value to a second value in response to the input signal attaining a first threshold value. The output signal is configured to change from the second value to the first value in response to the input signal subsequently attaining a second threshold value. A current limiting circuit is connected to the comparator circuit and operative to limit a leakage current of the comparator circuit.

20 Claims, 9 Drawing Sheets

(56) References Cited

U.S. PATENT DOCUMENTS

| | | |
|---|---|---|
| 2006/0071653 A1 | 4/2006 | Gattiker et al. |
| 2006/0091961 A1 | 5/2006 | Briskin et al. |
| 2009/0027087 A1* | 1/2009 | Sukup .............. G01R 19/16538 327/72 |
| 2014/0077842 A1 | 3/2014 | Zhang et al. |
| 2020/0119724 A1 | 4/2020 | Tejada et al. |

* cited by examiner

POWER DETECTION CIRCUIT

CROSS-REFERENCE

This application is a continuation of U.S. patent application Ser. No. 18/178,900 filed Mar. 6, 2023, which is a continuation of U.S. patent application Ser. No. 16/935,608 filed Jul. 22, 2020, now U.S. Pat. No. 11,598,794, the disclosure of each of which is hereby incorporated herein by reference in its entirety.

BACKGROUND

It is often desirable to detect flow of power to a circuit such as in an on-chip power to reduce or prevent interface leakage in a dual power system. For example, a power detector can be configured to detect the voltage level of an input power. When the voltage level is higher than a certain threshold, the power detector outputs a specific logic state to indicate that the power is on. When the voltage is lower than a certain threshold, the power detector outputs another logic state to indicate that the power is off.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
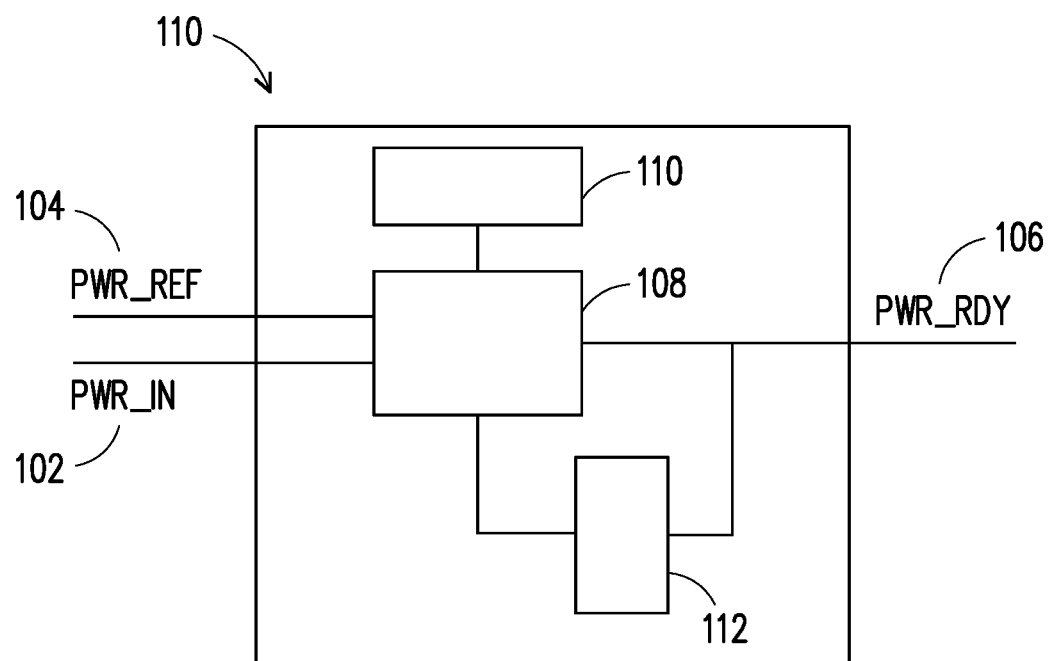
FIG. 1 is a schematic diagram of a power detection circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

There are known techniques for detecting flow of power to the circuit. However, these known techniques suffer from disadvantages such as high leakage of the power. The leakage causes inefficiency and increased power consumption by the circuit. FIG. 1 is a block diagram of a power detection circuit, in accordance with some embodiments. Power detection circuit 100 can be associated with a device or a circuit, and is operative to determine a status of an input voltage or an input power to the associated device or the circuit. For example, power detection circuit 100 is operative to continuously compare a value of the input voltage or the input power with a first threshold value and a second threshold value. Based on the comparison, power detection circuit 100 is operative to provide an output signal with a predetermined value indicating whether the input voltage or the input power above or below the first threshold value and the second threshold value. For example, power detection circuit 100 is operative to provide an output signal having a first logic value in response to determining that the input voltage to the associated circuit or device is more than (or has attained) the first threshold value. In addition, power detection circuit 100 is operative to subsequently provide the output signal having a second logic value in response to determining that the input voltage to the associated circuit or device is lower than (or has attained) the second threshold value subsequent to attaining the first threshold value. That is, power detection circuit 100 is operative to change a value of the output signal from the first logic value to the second logic value in response to the input voltage dropping below the second threshold value subsequent to reaching the first threshold value.

As shown in FIG. 1, power detection circuit 100 includes a first input 102 (also referred to as PWR_IN 102). In addition, power detection circuit 100 includes a second input 104 (also referred to as PWR_REF 104). First input 102 (that is, PWR_IN 102) is operative to receive an input signal and second input 104 (that is, PWR_REF 104) is operative to receive a reference signal. The input signal is representative of the input voltage or the input power being provided to the associated device or circuit. The reference signal is representative of a supply voltage (also referred to as a supply power or a reference voltage) being applied to the associated device or circuit. In some embodiments, the input signal is also referred to as a PWR_IN signal and the output signal is referred to as a PWR_RDY signal. Although power detection circuit 100 of FIG. 1 is shown to include only one supply voltage input (that is, PWR_REF 104), it will be apparent to a person with ordinary skill in the art that power detection circuit 100 may include more than one supply voltage inputs.

Continuing with FIG. 1, power detection circuit 100 further includes a comparator circuit 108, a current limiting circuit 110, and a feedback circuit 112. Comparator circuit 108 is operative to generate the output signal (that is, the PWR_RDY signal) responsive to the input signal (that is, the PWR_IN signal). For example, comparator circuit 108 is operative to continuously compare a value of the input signal with the first threshold value and the second threshold value. In example embodiments, each of the first threshold value and the second threshold value can be based on the PWR_REF signal. For example, the first threshold value can be 0.5 times a voltage of the PWR_REF signal and the second threshold value can be 0.3 times a value of the PWR_REF signal.

Comparator circuit 108 is further operative to generate, based on the comparison, the output signal having a first logic value (that is, a logic value one or a logic value zero) in response to the input signal attaining the first threshold value, and provide the output signal having a second logic value (that is, a logic value zero or a logic value one), when the input signal subsequently attains the second threshold value. Comparator circuit 108 includes one or more transistors. In example embodiments, transistors of comparator circuit 108 may each include a metal oxide semiconductor field effect transistor, an n-channel metal oxide semiconductor transistor, a p-channel metal oxide semiconductor transistor, or a complementary metal oxide semiconductor transistor. However, other types of transistors are within the scope of the disclosure.

Current limiting circuit 110 is connected between comparator circuit 108 and the supply voltage. In addition, current limiting circuit 110 can also be connected between comparator circuit 108 and the ground. Current limiting circuit 110 is operative to limit a leakage current of comparator circuit 108. For example, current limiting circuit 110 is operative to limit the leakage current of the one or more transistors of comparator circuit 108. Current limiting circuit 110 includes one or more resistors or transistors. In example embodiments, transistors of current limiting circuit 110 may include a metal oxide semiconductor field effect transistor, an n-channel metal oxide semiconductor transistor, a p-channel metal oxide semiconductor transistor, and a complementary metal oxide semiconductor transistor. In addition, it will be apparent a person with skill in the art after reading this disclosure that other types of transistors are within the scope of the disclosure.

Feedback circuit 112 is connected to comparator circuit 108. In some examples, feedback circuit is connected in parallel to current limiting circuit 110. Feedback circuit 112 is operative to control one or both of the first threshold value and the second threshold value associated with comparator circuit 108. Feedback circuit 112 includes one or more transistors. In example embodiments, transistors of feedback circuit 112 may include a metal oxide semiconductor field effect transistor, an n-channel metal oxide semiconductor transistor, a p-channel metal oxide semiconductor transistor, and a complementary metal oxide semiconductor transistor. However, other types of transistors are within the scope of the disclosure.

Figure 2:
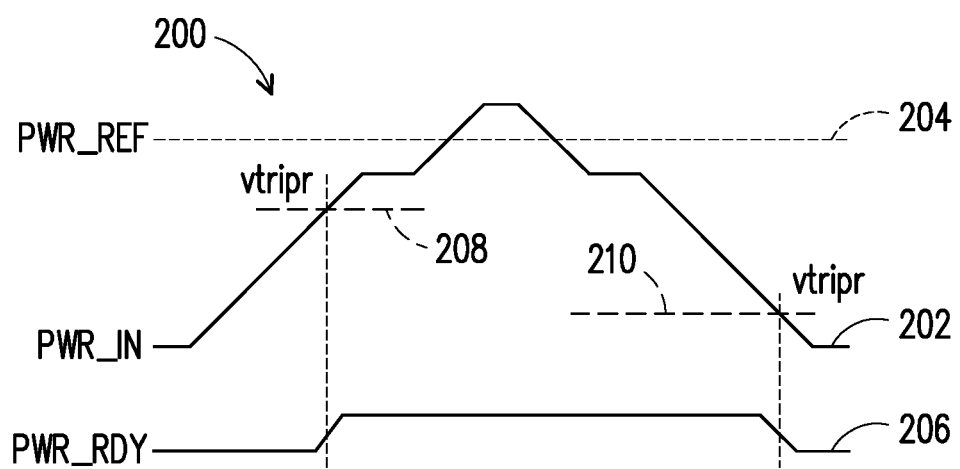
FIG. 2 is a graph illustrating signals of a power detection circuit, in accordance with some embodiments.

FIG. 2 is a graph 200 illustrating plots of the input signal and the output signal of power detection circuit 100, in accordance with some embodiments. As shown in FIG. 2, graph 200 includes a first plot 202 representing the input signal (that is, the PWR_IN signal), a second plot 204 representing the reference signal (that is, the PWR_REF signal), and a third plot 206 representing the output signal (that is, the PWR_RDY signal).

As illustrated in first plot 210 and third plot 206 of graph 200, when a value of the input signal (that is, the PWR_IN signal) crosses the first threshold value (also referred to as vtripr 208), a value of the output signal (that is, the PWR_RDY signal) changes from a first logic value to a second logic value (that is, from a logic value zero to a logic value one), and remains at the second logic as long as the value of the PWR_IN signal remains above the second threshold value (also referred to as vtripf 210). However, when the value of the PWR_IN signal subsequently attains (or drop below) the second threshold value (that is, vtripf 210), the value of the PWR_RDY signal changes from the second logic value to the first logic value (that is, from a logic value one to a logic value zero).

In some embodiments, the first threshold value (that is, vtripr 208) and the second threshold value (that is, vtripf 210) is predetermined. For example, each of the first threshold value (that is, vtripr 208) and the second threshold value (that is, vtripf 210) is predetermined by a user or by design of power detection circuit 100. Moreover, the first threshold value (that is, vtripr 208) can be different than the second threshold (that is, vtripf 210). For example, the first threshold value (that is, vtripr 208) is higher than the second threshold value (that is, vtripf 210). In example embodiments, the first threshold value can be a minimum voltage required to switch-on components of the device or circuit associated with power detection circuit 100. In addition, the second threshold value can be a minimum voltage required for the components of the device or circuit associated with power detection circuit 100 to remain switched on. In some embodiments, each of the first threshold value (that is, vtripr 208) and the second threshold value (that is, vtripf 210) is dynamically configured.

Figure 3:
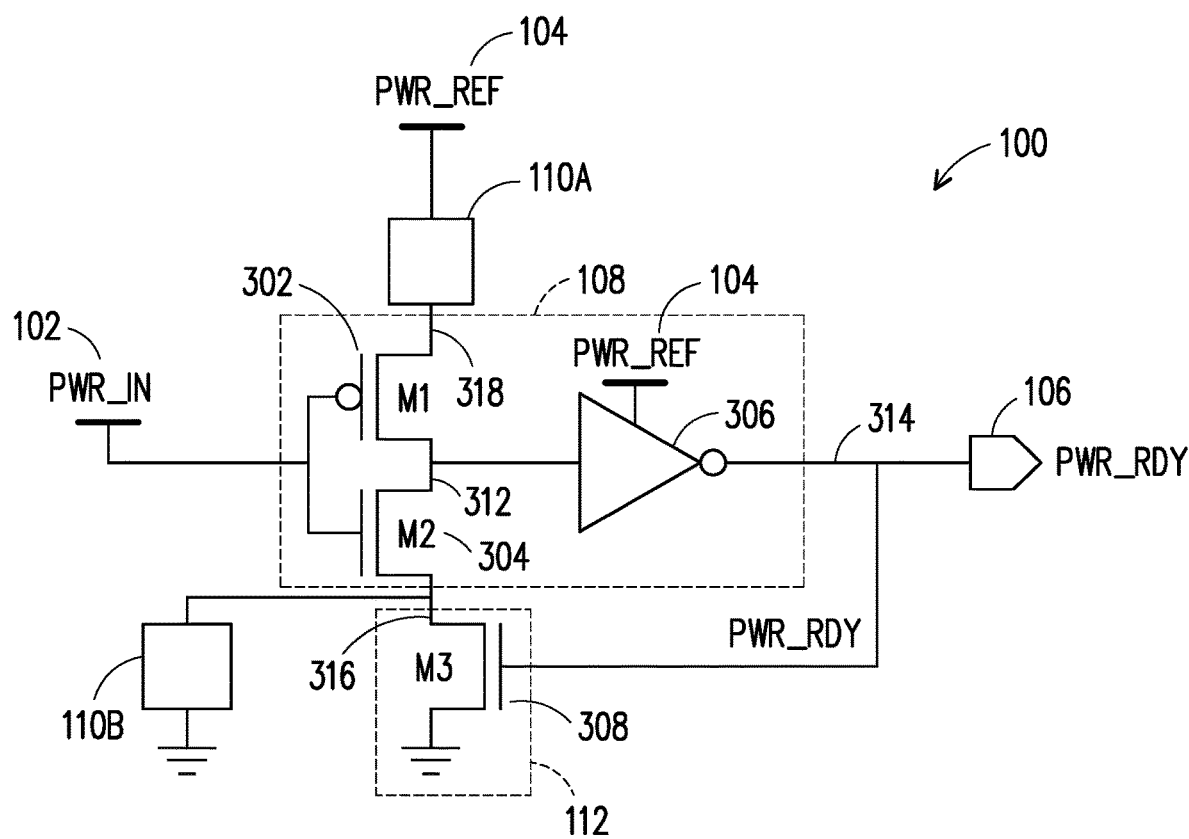
FIG. 3 is a partial block diagram and a partial circuit diagram of a power detection circuit, in accordance with some embodiments.

FIG. 3 is a partial block diagram and a partial circuit diagram of power detection circuit 100, in accordance with some embodiments. As shown in FIG. 3, power detection circuit 100 includes comparator circuit 108, a first current limiting circuit 110A, a second current limiting circuit 110B, and a feedback circuit 112. Although power detection circuit 100 of FIG. 3 is shown to include two current limiting circuits (that is, first current limiting circuit 110A and second current limiting circuit 110B), it will be apparent to a person skilled in the art after reading this disclosure that power detection circuit 100 may include only one current limiting circuit 110 or more than two current limiting circuits. In addition, power detection circuit 100 includes a first input 102 (that is, PWR_IN 102) and second inputs 104 (that is, PWR_REF 104).

Comparator circuit 108 is operative to determine a value of the input signal (that is, the PWR_IN signal) and provide the output signal (that is, the PWR_RDY signal) by comparing the determined value with a plurality of threshold values (for example, the first threshold value (that is, vtripr 208) and the second threshold value (that is, vtripf 210)). As shown in FIG. 3, comparator circuit 108 includes a first transistor M1 302, a second transistor M2 304, and an inverter 306. First transistor M1 302 can be a pMOS transistor and second transistor M2 304 can be an nMOS transistor. However, it will be apparent to a person with ordinary skill in the art after reading this disclosure that other types of transistors are within the scope of the disclosure.

Inverter 306 is a NOT logic gate. However, it will be apparent to a person with ordinary skill in the art after reading this disclosure that other types of inverters are within the scope of the disclosure. Feedback circuit 112 includes a third transistor M3 308. Third transistor M3 308 can be an nMOS transistor. However, it will be apparent to a person with ordinary skill in the art after reading this disclosure that other types of transistors are within the scope of the disclosure.

A drain/source of first transistor M1 302 is connected to a source/drain of second transistor M2 304 at a first node 312. In addition, an input of inverter 306 is connected to first node 312. An output of inverter 306 is connected to a second node 314. Output of inverter 306 is also an output of comparator circuit 108 and power detection circuit 100. The output of comparator circuit 108 is provided at PWR_RDY 106 as the output signal.

Continuing with FIG. 3, a drain/source of second transistor M2 304 is connected to a third node 316. Moreover, a source/drain of third transistor M3 308 is also connected to third node 316. In addition, a first terminal of second current limiting circuit 110B is connected to third node 316. A second terminal of second current limiting circuit 110B is connected to the ground. In addition, a drain/source of third transistor M3 308 is also connected to the ground. Thus, third transistor M3 308 is connected in parallel to second current limiting circuit 110B. Therefore, second current limiting circuit 110B is connected in parallel to feedback circuit 112.

Still continuing with FIG. 3, a source drain of first transistor 302 is connected to a fourth node 318. In addition, a second terminal of first current limiting circuit 110A is connected to fourth node 318. Moreover, a first terminal of first current limiting circuit 110A is connected to the supply voltage (that is, PWR_REF 104). Hence, first current limiting circuit 110A is connected between the supply voltage and comparator circuit 108. As will be discussed further below, first current limiting circuit 110A is operative to control or limit a leakage current of comparator circuit 108 through PWR_REF 104.

A first terminal of second current limiting circuit 110B is connected to third node 316 and a second terminal of second current limiting circuit 110B is connected to the ground. Hence, second current limiting circuit 110B is connected between comparator circuit 108 and the ground. Thus, second current limiting circuit 110B is operative to control or limit a leakage current of comparator circuit 108 to the ground.

Figure 4:
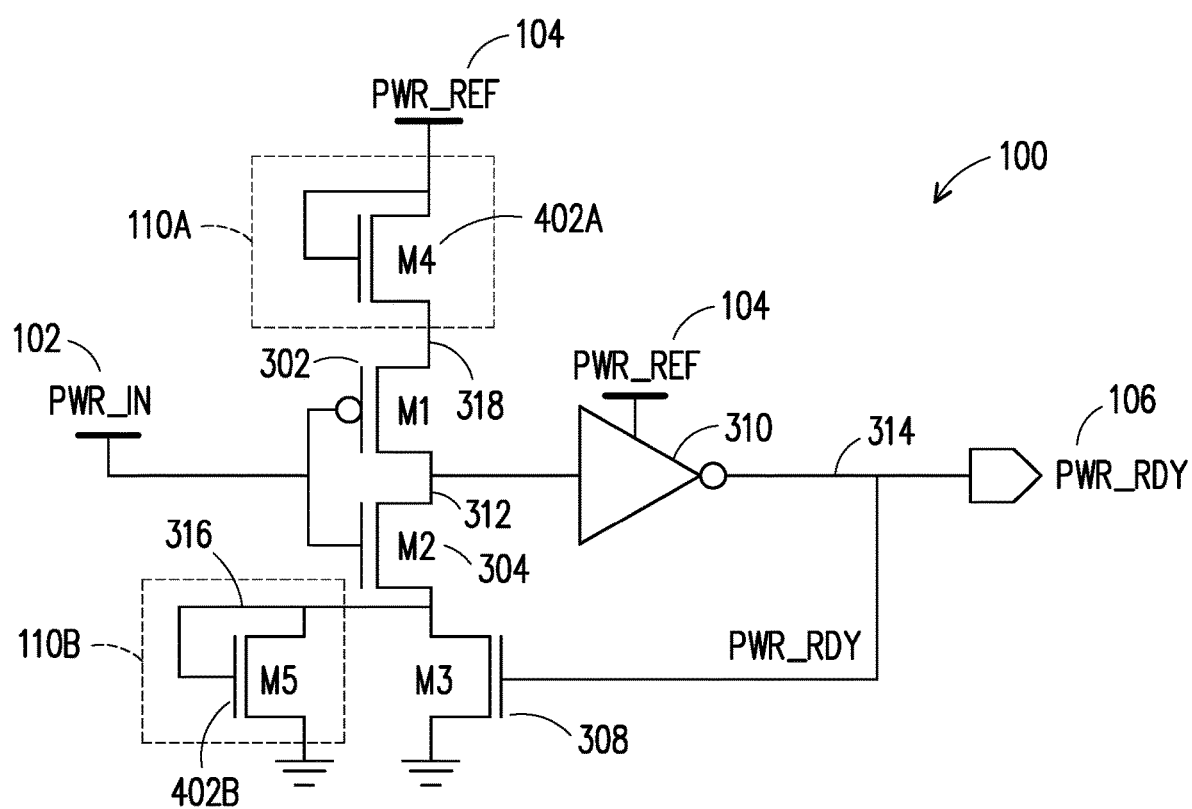
FIG. 4 is an example circuit diagram of a power detection circuit, in accordance with some embodiments.

FIG. 4 is an example circuit diagram of power detection circuit 100 in accordance with some embodiments. As shown in FIG. 4, first current limiting circuit 110A includes a fourth transistor M4 402A and second current limiting circuit 110B includes a fifth transistor M5 402B. Each of fourth transistor M4 402A of first current limiting circuit 110A and fifth transistor M5 402B of second current limiting circuit 110B is an nMOS transistor. However, it will be apparent to a person with ordinary skill in the art after reading this disclosure that other types of transistors are within the scope of the disclosure.

Continuing with FIG. 4, a source/drain of fourth transistor M4 402A of first current limiting circuit 110A is connected to PWR_REF 104 (that is, the supply voltage). Moreover, a gate of fourth transistor M4 402A is also connected to PWR_REF 104 (that is, the supply voltage). In addition, a drain/source of fourth transistor M4 402A is connected to fourth node 318. Hence, fourth transistor M4 402A is connected between the supply voltage and comparator circuit 108. In operation, fourth transistor M4 402A is operative to control or limit a leakage current of comparator circuit 108 through PWR_REF 104.

A source/drain of fifth transistor M5 402B is connected to third node 316. Moreover, a gate of fifth transistor M5 402B is also connected to third node 316. In addition, a drain/source of fifth transistor M5 402B is connected to the ground. Hence, fifth transistor M5 402B is connected between comparator circuit 108 and the ground. In operation, fifth transistor M5 402B is operative to control or limit a leakage current of comparator circuit 108 to the ground.

Figure 5A:
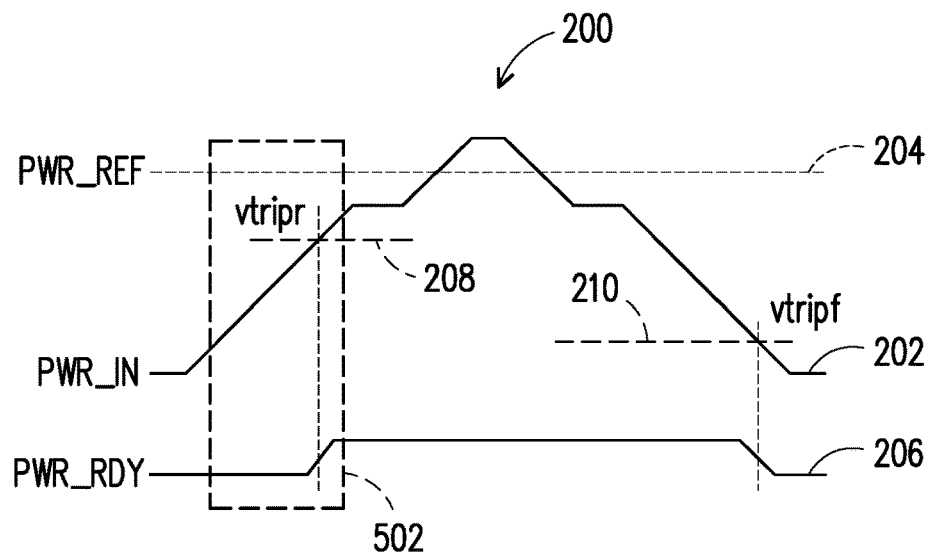
FIGS. 5A and 5B illustrates power-on detection, in accordance with some embodiments.
Figure 5B:
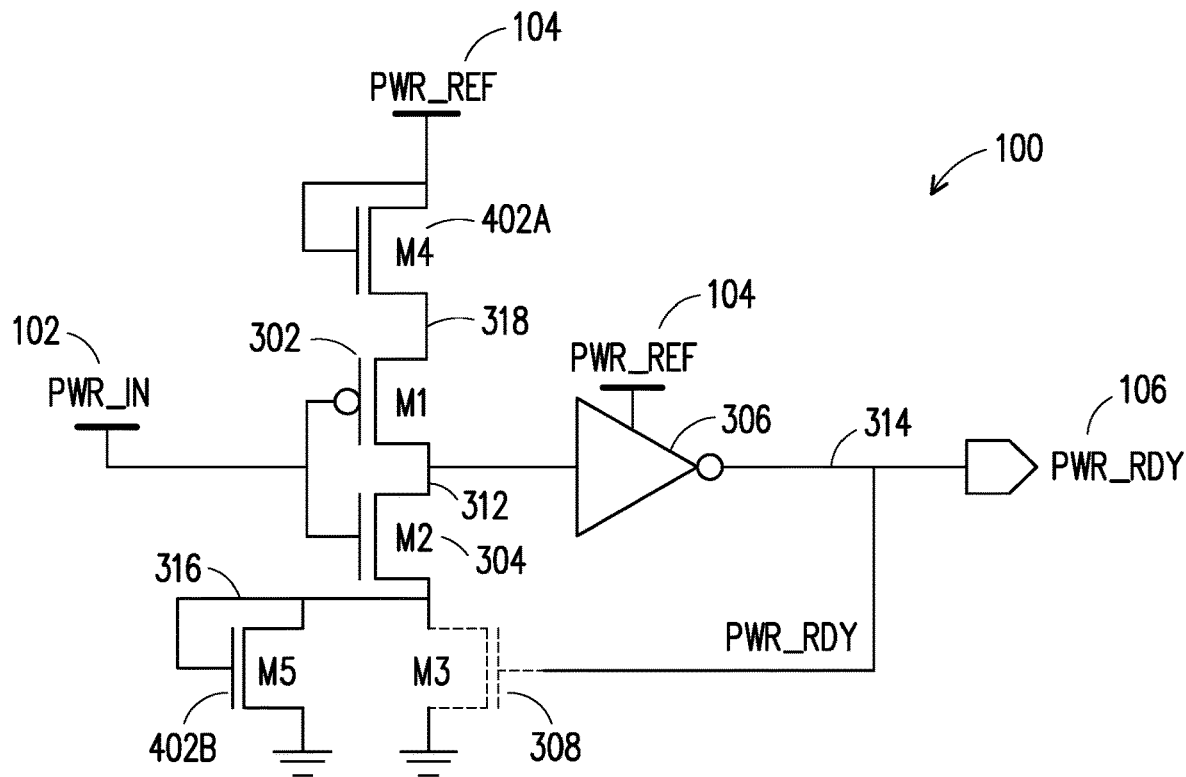

FIGS. 5A and 5B illustrates power-on detection, in accordance with some embodiments. A power-on region 502 of the input signal is shown in FIG. 5A. As shown in FIG. 5A, power-on region 502 represents a region which is in vicinity of the first threshold value (that is, vtripr 208) of first plot 202 representing the input signal (that is, the input voltage or the input power). In example embodiments, a value of the input signal (represented by first plot 202) in power-on region 502 is less than the first threshold value (that is, vtripr 208) but is sufficient to switch-on first transistor M1 302 and second transistor M2 304 of comparator circuit 108.

In example embodiments, since a value of the input signal (represented by first plot 202) in power-on region 502 is less than the first threshold value (that is, vtripr 208), the value of the output signal of power detection circuit 100 is at a logic value zero. Hence, second node 314 of power detection circuit 100 is at a logic value zero. Since second node 314 is at a logic value zero, first node 312 of power detection circuit 100 is at a logic value one. In addition, in power-on region 502, a value of the input signal is still not enough to switch-on second transistor M2 304 of comparator circuit 108. Therefore, second transistor M2 304 of comparator circuit 108 is still switched-off. However, in power-on region 502, first transistor M1 302 of comparator circuit 108 is switched-on. In addition, since second node 314 is at a logic value zero, third transistor M3 308 of feedback circuit 112 of power detection circuit 100 is disconnected from power detection circuit 100 (the disconnection being represented by dashed lines).

Moreover, in power-on region 502, since second transistor M2 304 of comparator circuit 108 is switched-off, fifth transistor M5 402B of second current limiting circuit 110B is also switched-off, thereby limiting the leakage current from comparator circuit 108 to the ground. In addition, although fourth transistor M4 402A of first current limiting circuit 110A is switched-on, the first terminal of fourth transistor M4 402A is connected to the supply voltage which is higher than the input voltage, thereby limiting the leakage current from comparator circuit 108 to the supply voltage. Therefore, the first threshold value is determined by one or more of first transistor M1 302, second transistor M2 304, fourth transistor M4 402A, and fifth transistor 402B. For example, the first threshold value is determined by a width, a type of material, or other intrinsic properties of one or more of first transistor M1 302, second transistor M2 304, fourth transistor M4 402A, and fifth transistor M5 402B.

For example, a current through fourth transistor M4 402A is provided as:

$$I_{M4} = 1/2K_4(V_{PWR\_REF} - V_x - V_{t4})^2(1 + \lambda_4(V_{PWR\_REF} - V_x)) \quad (1)$$

Similarly, a current through first transistor M1 302 is provided as:

$$I_{M1} = 1/2K_1(Vx - V_{tripr} - V_{t1})^2(1 + \lambda_1(V_x - V_0)) \quad (2)$$

In addition, a current through second transistor M2 304 is provided as:

$$I_{M2} = 1/2K_2(V_{tripr} - V_y - V_{t2})^2(1 + \lambda_2(V_0 - V_y)) \quad (3)$$

Moreover, a current through fifth transistor M5 402B is provided as:

$$I_{M5} = 1/2K_5(V_y - V_{t5})^2(1 + \lambda_5(V_y)) \quad (4)$$

Where $V_x$ is a voltage of fourth node 318, $V_y$ is a voltage of first node 312, and $V_0$ is a voltage of third node 316.

In FIG. 5B, $I_{M4}$ is equal to $I_{M1}$ which is equal to $I_{M2}$ which is equal to $I_{M5}$. That is:

$$I_{M4} = I_{M1} = I_{M2} = I_{M5} \quad (5)$$

In addition, to simplify the calculation, if one assumes that K, Vt, and λ are same for each of first transistor M1 302, second transistor M2 304, fourth transistor M4 402A, and fifth transistor M5 402B. In addition, $V_0$ is assumed to be equal to $0.5(V_{PWR\_REF})$. Hence, from equations (1), (2), (3), (4), and (5):

$$V_x = 0.75(V_{PWR\_REF})$$
$$V_y = 0.25(V_{PWR\_REF})$$
$$V_{tripr} = 0.50(V_{PWR\_REF})$$

Therefore, in example embodiments, the first threshold Vtripr is varied by varying K, Vt, and λ of each of first transistor M1 302, second transistor M2 304, fourth transistor M4 402A, and fifth transistor M5 402B.

Figure 6A:
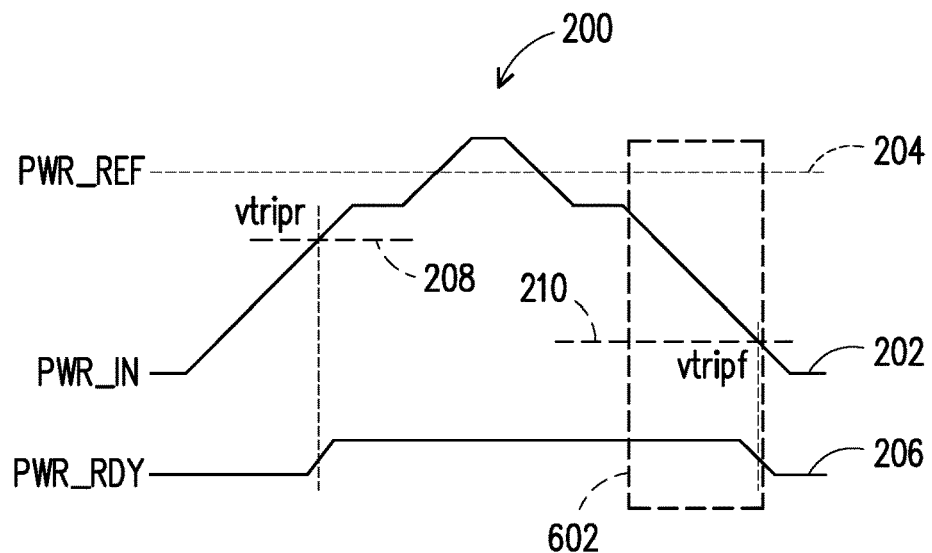
FIGS. 6A and 6B illustrates power-off detection, in accordance with some embodiments.
Figure 6B:
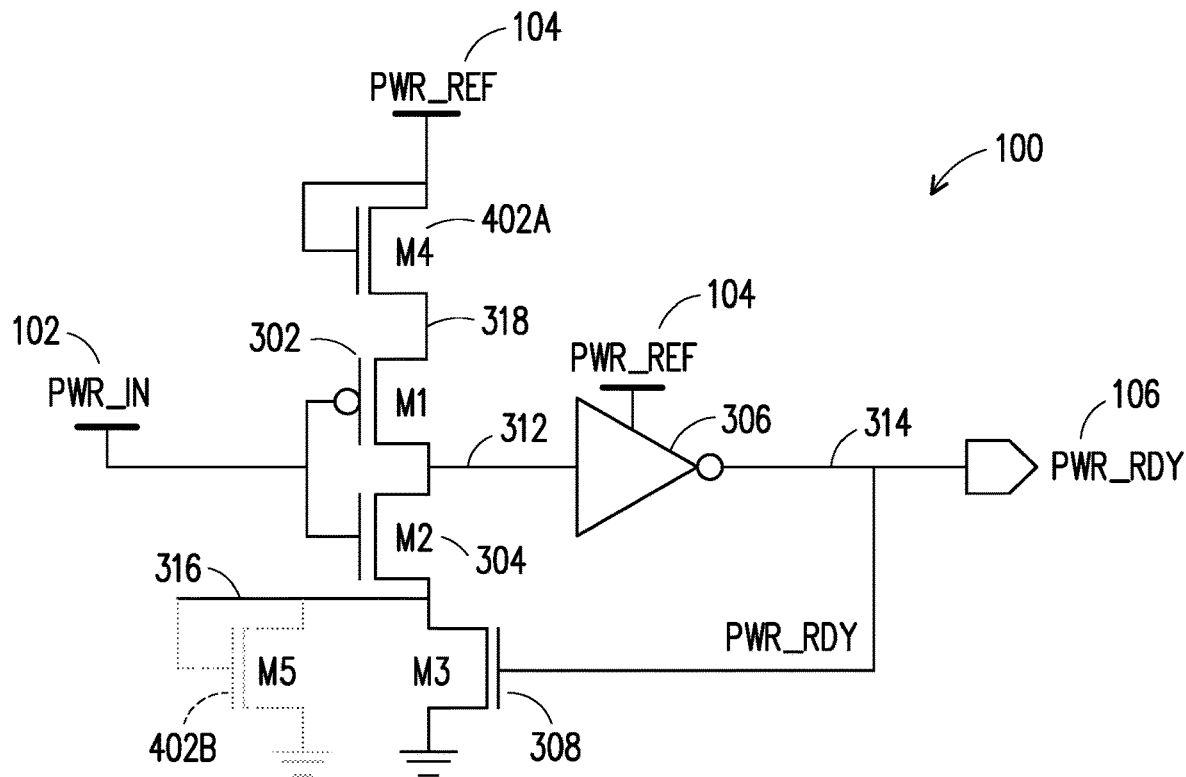

FIGS. 6A and 6B illustrates power-off detection, in accordance with some embodiments. A power-off region 602 of the input signal is shown in FIG. 6A. As shown in FIG. 6A, power-off region 602 represents a region which is in vicinity of the second threshold value (that is, vtripf 210) of first plot 202 representing the input signal (that is, the input voltage or the input power). In example embodiments, a value of the input signal (represented by first plot 202) in power-off region 602 is more than the second threshold value (that is, vtripf 210) and less than the first threshold (that is, vtripr 208) but is not sufficient to switch-off second transistor M2 304 of comparator circuit 108.

In example embodiments, even though lower than the first threshold value, a value of the input signal (represented by first plot 202) in power-off region 602 is still more than the second threshold value (that is, vtripf 210), the value of the output signal of power detection circuit 100 is still at a logic value one. Hence, second node 314 of power detection circuit 100 is still at a logic value one. Since second node 314 is at a logic value one, first node 312 of power detection circuit 100 is at a logic value zero. In addition, although lower than the first threshold value (vtripr 208), a value of the input signal in switch-off region 602 is still not low enough to switch-off second transistor M2 304 of comparator circuit 108. Therefore, in power-off region 602, first transistor M1 302 of comparator circuit 108 is switched-off and second transistor M2 304 of comparator circuit 108 is switched-on. In addition, fourth transistor M4 402A of first current limiting circuit 110A is also switched-off thereby limiting the leakage current of comparator circuit 108 through PWR_REF 104. For example, when the input signal (represented by first plot 202) is near a threshold value of power detection circuit 100, first transistor M1 302 and second transistor M2 304 may be simultaneously switched-on thereby creating a leakage path. By adding current limiting circuit 110, a bias voltage (Vgs) of first transistor M1 302 and a bias voltage (Vgs) of second transistor M2 304 is reduced due to a voltage drop created by current limiting circuit 110. Therefore, the leakage current is reduced according to a saturation current equation Id=½K (Vgs−Vt)^2, where Vt is a threshold voltage for first transistor M1 302 and second transistor M2 304.

In addition, in power-off region 602, since second node 314 is at a logic value one, third transistor M3 308 of feedback circuit 112 of power detection circuit 100 is switched-on. Moreover, since third transistor M3 308 is switched-on, third node 316 is at a logic value zero. Therefore, fifth transistor M5 402B of second current limiting circuit 110B is disconnected from power detection circuit 100 (the disconnection represented by dashed lines). In addition, the second threshold value (that is, vtripf 210) is determined by one or more of first transistor M1 302, second transistor M2 304, third transistor M3 308, and fourth transistor M4 402A. For example, the second threshold value is determined by a width, a type of material, or other intrinsic properties of one or more of first transistor M1 302, second transistor M2 304, third transistor M3 308, and fourth transistor M4 402A.

For example, a current through fourth transistor M4 402A is provided as:

$$I_{M4} = 1/2K_4(V_{PWR\_REF} - V_x - V_{t4})^2(1 + \lambda_4(V_{PWR\_REF} - V_x)) \quad (6)$$

Similarly, a current through first transistor M1 302 is provided as:

$$I_{M1} = 1/2K_1(Vx - V_{tripf} - V_{t1})^2(1 + \lambda_1(V_x - V_0)) \quad (7)$$

In addition, a current through second transistor M2 304 is provided as:

$$I_{M2} = 1/2K_2(V_{tripf} - V_y - V_{t2})^2(1 + \lambda_2(V_0 - V_y)) \quad (8)$$

Moreover, a current through third transistor M3 308 whish can be assumed to operate in a linear mode, is provided as:

$$I_{M3} = K_3(V_{PWR\_REF} - V_{t3})V_y \quad (9)$$

In FIG. 6B, $I_{M4}$ is equal to $I_{M1}$ which is equal to $I_{M2}$ which is equal to $I_{M5}$. That is:

$$I_{M4} = I_{M1} = I_{M2} = I_{M3} \quad (10)$$

In addition, to simplify the calculation, if one assumes that K, Vt, and λ are same for each of first transistor M1 302, second transistor M2 304, fourth transistor M4 402A, and third transistor M3 308. In addition, $V_0$ is assumed to be equal to $0.5(V_{PWR\_REF})$ and $V_y$ is equal to 0. Hence, from equations (6), (7), (8), (9), and (10):

$$V_x = 2/3(V_{PWR\_REF})$$
$$V_{tripf} = 1/3(V_{PWR\_REF})$$

Therefore, in example embodiments, the second threshold Vtripf is varied by varying K, Vt, and λ of each of first transistor M1 302, second transistor M2 304, fourth transistor M4 402A, and third transistor M3 308.

Figure 7:
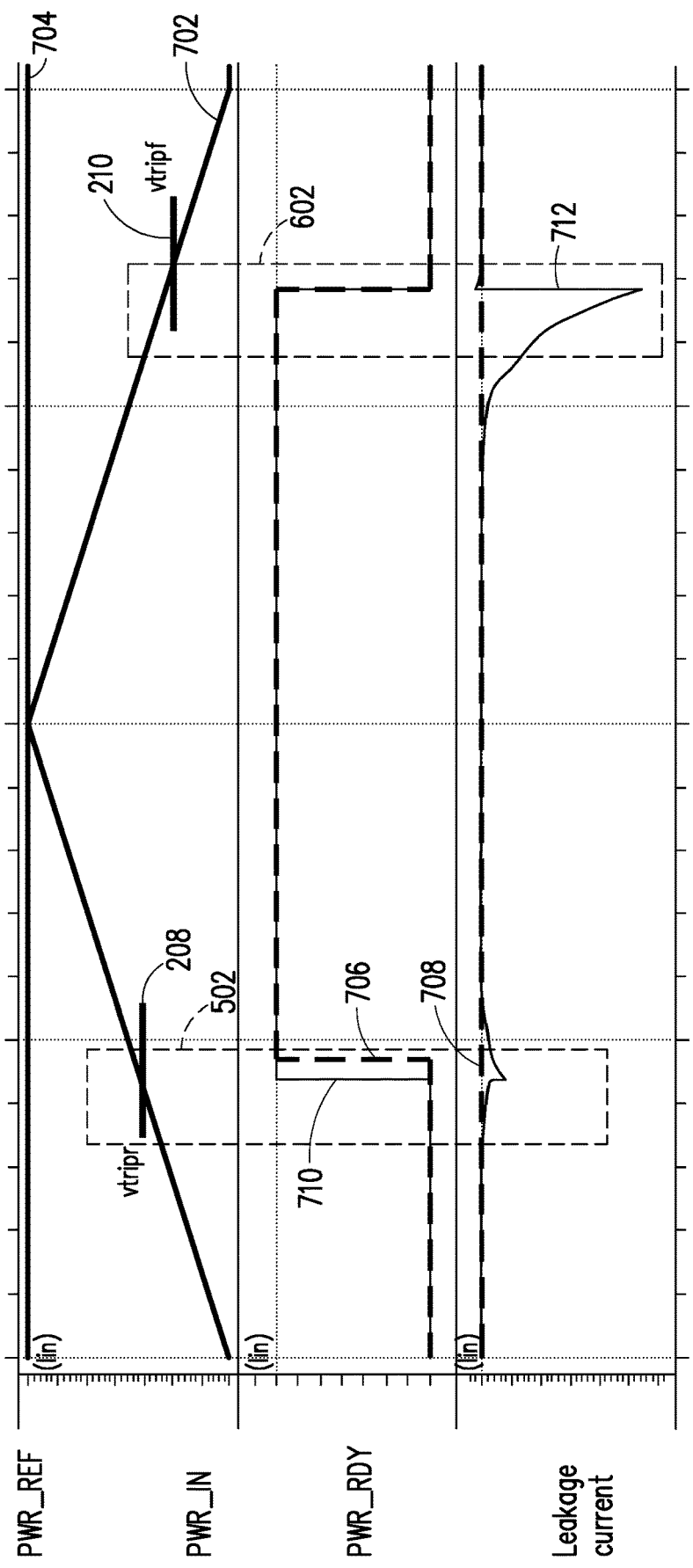
FIG. 7 is graph illustrating leakage current of a power detection circuit, in some embodiments of the disclosure.

FIG. 7 is graph 700 illustrating leakage current of power detection circuit 100, in some embodiments of the disclosure. As shown in FIG. 7, graph 700 includes a first plot 702 representing the input signal, a second plot 704 representing the reference signal, third plot 706 representing the PWR_RDY signal (represented by a dashed line), fourth plot 708 representing the leakage current (represented by a dashed line), a fifth plot 710 representing the PWR_RDY signal of a conventional power detection circuit (represented by a solid line), and a sixth plot 712 representing leakage current in the conventional power detection circuit (represented by a solid line). As shown by first plot 702 and third plot 706 of graph 700, PWR_RDY signal changes from a first logic value (for example, a logic value zero) to a second logic value (for example a logic value one) when the input signal attains the first threshold (represented as vtripr 208). In addition, and as shown by first plot 702 and third plot 706 graph 700, the PWR_RDY signal changes from the second logic value (for example, a logic value one) to the first logic value (for example, a logic value zero) when the input signal drops below the second threshold (represented as vtripf 210) subsequent to attaining the first threshold.

Continuing with FIG. 7, the leakage current (represented by fourth plot 708) remains constant and does not vary with the change in the input voltage compared to a sharp increase in the leakage current of the conventional power detection circuit (represented by sixth plot 712). In addition, and as shown in fourth plot 708, an increase in the leakage current is limited in the vicinity of power-on region 502 and power-off region 602. However, the increase is limited compared to a sharp increase in the conventional power detection circuit (as shown in sixth plot 712).

Figure 8:
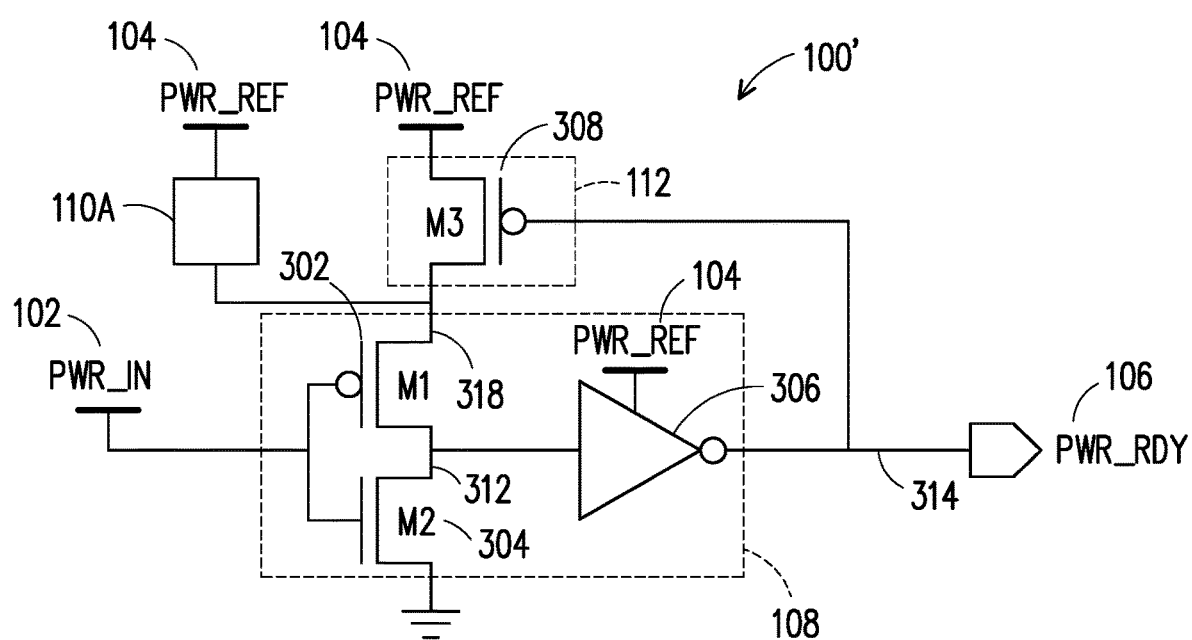
FIG. 8 is a partial block diagram and a partial circuit diagram of a first alternative power detection circuit, in accordance with some embodiments.

FIG. 8 is a partial block diagram and a partial circuit diagram of a first alternative power detection circuit 100', in accordance with some embodiments. As shown in FIG. 8, first alternative power detection circuit 100' includes first current limiting circuit 110A. In addition, first alternative power detection circuit 100' includes first transistor M1 302, second transistor M2 304, third transistor M3 308, and inverter 306. First transistor M1 302, second transistor M2 304, and inverter 306 form comparator circuit 108. Third transistor M3 308 forms feedback circuit 112 which is connected in parallel to first current limiting circuit 110A. For example, gate of third transistor M3 308 is connected to second node 314, source/drain of third transistor M3 308 is connected to PWR_REF 104, and drain/source of third transistor M3 308 is connected to fourth node 318. First current limiting circuit 110A is connected between fourth node 318 and PWR_REF 104, and is operative to limit the leakage current of comparator circuit 108 via PWR_REF 104.

During operation, when a value of the input signal is less that the first threshold value (that is, vtripr 208), the value of the output signal of comparator circuit 108 is at a logic value zero. In addition, when a value of the input signal is less than the first threshold value (that is, vtripr 208), third transistor M3 308 is switched-on and first current limiting circuit 110A is bypassed. However, when a value of the input signal is greater than the second threshold value (that is, vtripf 210), third transistor M3 308 is switched-off and the leakage current is limited by first current limiting circuit 110A. Hence, and in accordance with example embodiments, first alternative power detection circuit 100' described with reference to FIG. 8 is operative to limit the leakage current when a value of the input signal is greater than the second threshold value (that is, vtripf 210).

Figure 9:
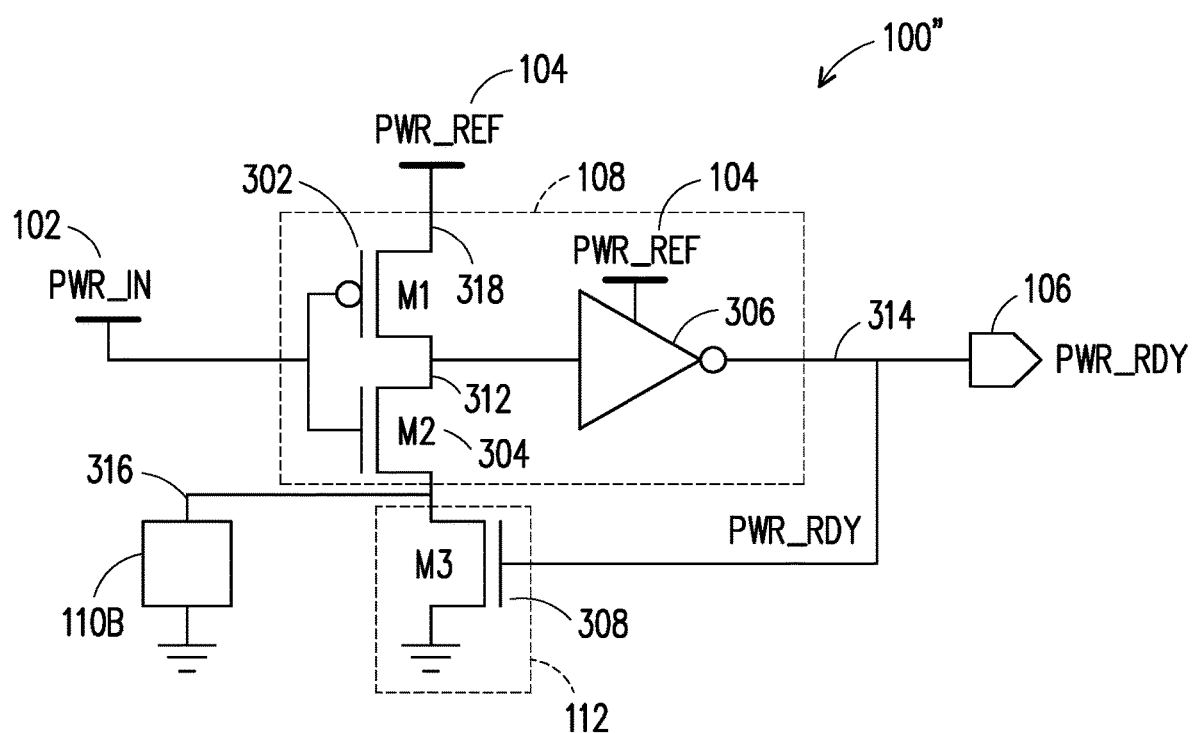
FIG. 9 is a partial block diagram and a partial circuit diagram of a second alternative power detection circuit, in accordance with some embodiments.

FIG. 9 is a partial block diagram and a partial circuit diagram of a second alternative power detection circuit 100", in accordance with some embodiments. As shown in FIG. 9, second alternative power detection circuit 100" includes second current limiting circuit 110B. In addition, first alternative power detection circuit 100' includes first transistor M1 302, second transistor M2 304, third transistor M3 308, and inverter 306. First transistor M1 302, second transistor M2 304, and inverter 306 form comparator circuit 108. Third transistor M3 308 forms feedback circuit 112 which is connected in parallel to second current limiting circuit 110B. For example, gate of third transistor M3 308 is connected to second node 314, source/drain of third transistor M3 308 is connected to third node 316, and drain/source of third transistor M3 308 is connected to the ground. Second current limiting circuit 110B is connected between third node 316 and the ground, and is operative to limit the leakage current of comparator circuit 108 via the ground.

During operation, when a value of the input signal is less that the first threshold value (that is, vtripr 208), the value of the output signal of comparator circuit 108 is at a logic value zero. In addition, when a value of the input signal is less that the first threshold value (that is, vtripr 208), third transistor M3 308 is switched-off. Hence, the leakage current is limit by second current limiting circuit 110B. However, when a value of the input signal is greater than the second threshold (that is, vtripf 210), third transistor M3 308 is switched-on and second current limiting circuit 110B is bypassed. Hence, and in accordance with example embodiments, second alternative power detection circuit 100" described with reference to FIG. 9 is operative to limit the leakage current when a value of the input signal is less than the first threshold value (that is, vtripr 208).

Figure 10:
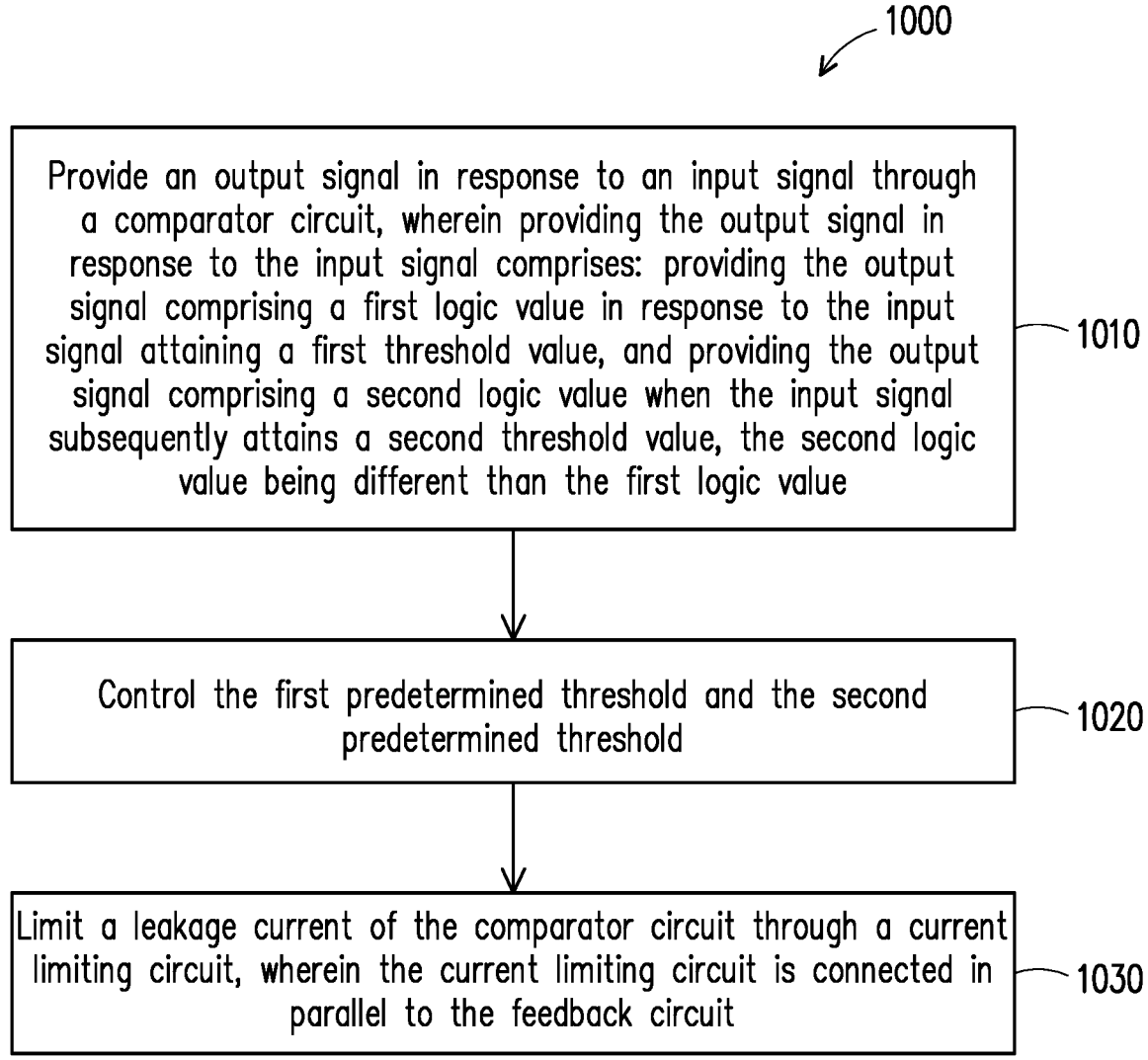
FIG. 10 is a flow diagram illustrating a method for detecting an input power in a circuit, in accordance with some embodiments.

FIG. 10 is a flow diagram illustrating a method 1000 for detecting an input power in a circuit, in accordance with some embodiments. For example, method 100 can be implemented in power detection circuits 100, 100' and 100"

described with reference to FIGS. 1, 3, 4, 5B, 6B, 8, and 9. Method 1000 may be performed by a processor. In addition, method 1000 may be stored as instructions on a memory device, which when executed by a processor can cause the processor to perform method 1000.

At block 1010 of method 1000, an output signal is provided in response to an input signal through a comparator circuit. For example, the PWR_IN signal is received at comparator 108 of power detection circuit 100 and is compared with a first threshold value (that is, vtripr 208). The PWR_RDY signal is provided by comparator circuit 108 in response to comparing the PWR_IN signal with the first threshold value (that is, vtripr 208). For example, providing the output signal in response to the input signal includes providing the PWR_RDY signal having a first logic value (that is, a logic value one) in response to the PWR_IN signal attaining the first threshold value (that is, vtripr 208) and providing the PWR_RDY signal comprising a second logic value (that is, a logic value zero) when the PWR_IN signal attains the second threshold value (that is, vtripf 210) subsequent to attaining the first threshold value (that is, vtripr 208). The second logic value is different than the first logic value.

At block 1020 of method 1000, the first threshold value (that is, vtripr 208) and the second threshold value (that is, vtripf 210) are controlled. For example, each of the first threshold (that is, vtripr 208) and the second threshold (that is, vtripf 210) is controlled by controlling a width, a type of material, or other intrinsic properties of one or more of first transistor M1 302, second transistor M2 304, third transistor M3 308, fourth transistor M4 402A, and fifth transistor M5 402B.

At block 1030 of method 1000, a leakage current of the comparator circuit is limited through a current limiting circuit. For example, the leakage current of comparator circuit 108 is limited through current limiting circuit 110 (that is, one or both of first current limiting circuit 110A and second current limiting circuit 110B). Current limiting circuit 110 is connected to comparator 108 and is also connected in parallel to feedback circuit 112.

In example embodiments, power detection circuit 100 described herein can be used for managing power in an associated device or circuit. Moreover, power detection circuit 100 prevent or limit power leakage from an associated device or circuit. For example, power detection circuit 100 can limit or reduce standby power leakage when the input voltage is near the trip point (that is the first threshold value and the second threshold value). In addition, feedback circuit 112 of power detection circuit 100 provides for the trip point control, that is, control of the first threshold value and the second threshold value. Therefore, power detection circuit 100 provides a different threshold for the power-on and the power-off detection. Moreover, each of the first threshold value and the second threshold value can be altered by altering feedback circuit 112. For example, the first threshold value and the second threshold value can be altered by altering characteristics of third transistor M3 306.

In accordance with example embodiments, a power detection circuit comprises: a comparator circuit operative to generate an output signal in response to an input signal, wherein the output signal is configured to change from a first value to a second value in response to the input signal attaining a first threshold value, and wherein the output signal is configured to change from the second value to the first value in response to the input signal subsequently attaining a second threshold value; and a current limiting circuit operative to limit a leakage current of the comparator circuit.

In example embodiments, a device comprises a power detection circuit, wherein the power detection circuit comprises: a comparator circuit operative to generate an output signal in response to an input signal, wherein the comparator circuit being operative to generate the output signal comprises the comparator circuit being operative to: provide the output signal comprising a first logic value in response to the input signal attaining a first threshold value, and provide the output signal comprising a second logic value when the input signal subsequently attains a second threshold value, the second logic value being different than the first logic value; a current limiting circuit operative to limit a leakage current of the comparator circuit; and a feedback circuit operative to control the first predetermined threshold and the second predetermined threshold.

In accordance with example embodiments, a method of detecting power in a circuit comprises: receiving an input signal at a comparator circuit; comparing, by the comparator circuit, the input signal with a first threshold value; providing, by the comparator circuit, an output signal based on comparing the input signal with the first threshold value, wherein providing the output signal based on comparing the input signal with the first threshold value comprises providing the output signal comprising a first logic value in response to the input signal attaining a first threshold value; comparing, by the comparator circuit, the input signal with a second threshold value subsequent to the input signal attaining the first threshold value; providing, by the comparator circuit, the output signal comprising a second value on response to the input signal attaining the second threshold value subsequent to attaining the first threshold value; controlling the first threshold value and the second threshold value through a feedback circuit, wherein the feedback circuit is connected to the comparator circuit; and limiting a leakage current of the comparator circuit through a current limiting circuit, wherein the current limiting circuit is connected in parallel to the feedback circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power detection circuit comprising:
    a comparator circuit operative to indicate a status of an input power, wherein an output of the comparator circuit is a first logic state when a voltage level of the input power is greater than a first threshold level indicating power is on, and wherein the output of the comparator circuit switches to a second logic state when the voltage level of the input power is subsequently lower than a second threshold level indicating the power is off;
    a current limiting circuit connected to the comparator circuit, wherein the current limiting circuit is operative to limit a leakage current of the comparator circuit; and a feedback circuit connected to the comparator circuit, wherein the feedback circuit is operative to control the first threshold level and the second threshold level.

2. A device comprising a power detection circuit, wherein the power detection circuit comprises:
a comparator circuit operative to determine a status of an input power, wherein the comparator circuit being operative to determine the status of an input power comprises the comparator circuit being operative to:
determine power to be on when a voltage level of the input power is greater than a first threshold level, and
determining the power to be off when the voltage level of the input power is subsequently lower than a second threshold level;
a current limiting circuit connected to the comparator circuit and operative to limit a leakage current of the comparator circuit; and
a feedback circuit connected to the comparator circuit and operative to control the first predetermined threshold and the second predetermined threshold, wherein the current limiting circuit is connected in parallel to the feedback circuit.

3. A method of detecting power in a circuit, the method comprising:
receiving an input power at a comparator circuit;
determining a status of the input power, by the comparator circuit, wherein determining the status of the input power comprises:
determining power to be on when a voltage level of the input power is greater than a first threshold level, and
determining the power to be off when the voltage level of the input power is subsequently lower than a second threshold level;
controlling the first threshold value and the second threshold value through a feedback circuit connected to the comparator circuit; and
limiting a leakage current of the comparator circuit through a current limiting circuit connected in parallel to the feedback circuit.

4. The method of claim 3, further comprising:
generating, by the comparator circuit, an output signal in response to the input signal, wherein generating the output signal comprises:
generating the output signal comprising a first logic value in response to the input signal attaining the first threshold value, and
generating the output signal comprising a second logic value when the input signal subsequently attains the second threshold value.

5. The method of claim 3, wherein the comparator circuit comprises a first transistor, a second transistor, and an inverter, wherein gates of each of the first transistor and the second transistor are connected to the input signal, wherein a drain/source of the first transistor is connected to the source/drain of the second transistor at a first node, wherein an input of the inverter is connected to the first node, and wherein an output of the inverter is operative to provide the output signal at a second node.

6. The method of claim 5, wherein the feedback circuit is connected to the second node.

7. The method of claim 5, wherein the feedback circuit comprises a third transistor, wherein a gate of the third transistor is connected to the second node, wherein a source/drain on the third transistor is connected to a third node, and wherein a drain/source of the third transistor is connected to the ground.

8. The method of claim 7, wherein the current limiting circuit comprises a fourth transistor, wherein a gate of the fourth transistor is connected to the third node, wherein a source/drain on the fourth transistor is connected to the third node, and wherein a drain/source of the fourth transistor is connected to the ground.

9. The power detection circuit of claim 1, wherein the comparator circuit comprises a first transistor, a second transistor, and an inverter, wherein gates of each of the first transistor and the second transistor are connected to the input signal, wherein a drain/source of the first transistor is connected to the source/drain of the second transistor at a first node, wherein an input of the inverter is connected to the first node, and wherein an output of the inverter is operative to provide the output signal at a second node.

10. The power detection circuit of claim 9, wherein the first transistor is an n-channel metal oxide semiconductor transistor, and wherein the second transistor is a p-channel metal oxide semiconductor transistor.

11. The power detection circuit of claim 9, wherein the feedback circuit is connected to the second node.

12. The power detection circuit of claim 9, wherein the feedback circuit comprises a third transistor, wherein a gate of the third transistor is connected to the second node, wherein a source/drain on the third transistor is connected to a third node, and wherein a drain/source of the third transistor is connected to the ground.

13. The power detection circuit of claim 12, wherein the second current limiting circuit comprises a fourth transistor, wherein a gate of the fourth transistor is connected to the third node, wherein a source/drain on the fourth transistor is connected to the third node, and wherein a drain/source of the fourth transistor is connected to the ground.

14. The power detection circuit of claim 13, wherein the first current limiting circuit comprises a fifth transistor, wherein a gate of the fifth transistor is connected to a supply voltage, wherein a source/drain on the fifth transistor is connected to the supply voltage, and wherein a drain/source of the fifth transistor is connected to a fourth node.

15. The power detection circuit of claim 13, wherein a source/drain of the first transistor is connected to the fourth node.

16. The device of claim 2, wherein the comparator circuit comprises a first transistor, a second transistor, and an inverter, wherein gates of each of the first transistor and the second transistor are connected to the input signal, wherein a drain/source of the first transistor is connected to the source/drain of the second transistor at a first node, wherein an input of the inverter is connected to the first node, and wherein an output of the inverter is operative to provide the output signal at a second node.

17. The device of claim 16, wherein the feedback circuit is connected to the second node.

18. The device of claim 16, wherein the feedback circuit comprises a third transistor, wherein a gate of the third transistor is connected to the second node, wherein a source/drain on the third transistor is connected to a third node, and wherein a drain/source of the third transistor is connected to the ground.

19. The device of claim 18, wherein the current limiting circuit comprises a fourth transistor, wherein a gate of the fourth transistor is connected to the third node, wherein a source/drain on the fourth transistor is connected to the third node, and wherein a drain/source of the fourth transistor is connected to the ground.

20. The device of claim 18, further comprising another first current limiting circuit comprising a fifth transistor, wherein a gate of the fifth transistor is connected to a supply voltage, wherein a source/drain on the fifth transistor is connected to the supply voltage, and wherein a drain/source of the fifth transistor is connected to a fourth node.

\* \* \* \* \*